United States Patent
Van Noort et al.

(10) Patent No.: US 7,381,656 B2
(45) Date of Patent: Jun. 3, 2008

(54) METHOD OF MANUFACTURING A SEMICONDUCTOR DEVICE AND SEMICONDUCTOR DEVICE OBTAINED BY MEANS OF SAID METHOD

(75) Inventors: Wibo Daniel Van Noort, Leuven (BE); Eyup Aksen, Leuven (BE)

(73) Assignee: NXP B.V., Eindhoven (NL)

( * ) Notice: Subject to any disclaimer, the term of this patent is extended or adjusted under 35 U.S.C. 154(b) by 5 days.

(21) Appl. No.: 10/599,032

(22) PCT Filed: Mar. 11, 2005

(86) PCT No.: PCT/IB2005/050883

§ 371 (c)(1),
(2), (4) Date: Sep. 18, 2006

(87) PCT Pub. No.: WO2005/093824

PCT Pub. Date: Oct. 6, 2005

(65) Prior Publication Data

US 2007/0197043 A1    Aug. 23, 2007

(30) Foreign Application Priority Data

Mar. 23, 2004  (EP) ................................. 04101185

(51) Int. Cl.
H01L 21/31  (2006.01)
H01L 21/469  (2006.01)

(52) U.S. Cl. ................ 438/758; 438/412; 438/149

(58) Field of Classification Search ............. 438/745, 438/705, 294, 689, 758, 149, 412, 424, 422; 257/330, 192, E21.548; 437/2, 3
See application file for complete search history.

(56) References Cited

U.S. PATENT DOCUMENTS 5,576,221 A * 11/1996 Takemura et al. ............ 438/57
5,972,758 A * 10/1999 Liang .......................... 438/294
6,285,057 B1 * 9/2001 Hopper et al. ............... 257/330
6,727,150 B2 * 4/2004 Tang .......................... 438/296
2001/0034109 A1 * 10/2001 Madson et al. ............. 438/412
2003/0045119 A1 * 3/2003 Wang et al. ................. 438/745
2008/0023742 A1 * 1/2008 Lee ............................ 257/296

FOREIGN PATENT DOCUMENTS

DE       3715232 A1    11/1988
EP       040280 A1     10/2000

* cited by examiner

*Primary Examiner*—Kenisha V Ford
(74) *Attorney, Agent, or Firm*—Peter Zawilski

(57) ABSTRACT

The invention relates to a method of manufacturing a semiconductor device comprising a substrate (1) and a semiconductor body (2) in which at least one semiconductor element is formed, wherein, in the semiconductor body (2), a semiconductor island (3) is formed by forming a first cavity (4) in the surface of the semiconductor body (2), the walls of said first cavity being covered with a first dielectric layer (6), after which, by means of underetching through the bottom of the cavity (4), a lateral part of the semiconductor body (2) is removed, thereby forming a cavity (20) in the semiconductor body (2) above which the semiconductor island (3) is formed, and wherein a second cavity (5) is formed in the surface of the semiconductor body (2), the walls of said second cavity being covered with a second dielectric layer, and one of the walls covered with said second dielectric layer forming a side wall of the semiconductor island (3).

According to the invention, the same dielectric layer (6) is chosen for the first and the second dielectric layer, a lateral size of the second cavity (5) and the thickness of the dielectric layer (6) are chosen such that the second cavity (5) becomes nearly completely filled by the dielectric layer (6), and the lateral sizes of the first cavity (4) are chosen such that the walls and the bottom of the first cavity (4) are provided with a uniform coating by the dielectric layer (6). In this way, a semiconductor island (3) which is isolated from its environment can be made using a minimum number of (masking) steps.

15 Claims, 5 Drawing Sheets

METHOD OF MANUFACTURING A SEMICONDUCTOR DEVICE AND SEMICONDUCTOR DEVICE OBTAINED BY MEANS OF SAID METHOD

The invention relates to a method of manufacturing a semiconductor device comprising a substrate and a semiconductor body in which at least one semiconductor element is formed, wherein, in the semiconductor body, a semiconductor island is formed by forming, in the surface of the semiconductor body, a first recess the walls of which are covered with a dielectric layer, after which a lateral part of the semiconductor body is removed by means of underetching via the bottom of the first recess, thereby forming a cavity in the semiconductor body above which the semiconductor island is formed, and wherein a second recess is formed in the surface of the semiconductor body, the walls of said second recess being covered with a further dielectric layer, and one of the walls of the second recess covered with the further dielectric layer being used to form a side wall of the semiconductor island.

Such a method can particularly suitably be used, inter alia, for the manufacture of, for example, semiconductor devices comprising integrated power devices. The part of the semiconductor body situated within the semiconductor island may then comprise, for example, a MOS (=Metal Oxide Semiconductor) transistor, while a part of the semiconductor body situated outside the semiconductor island may comprise one or more bipolar transistors.

A method of the type mentioned in the opening paragraph is known from European patent specification EP 1 043 769, published on 11 Oct. 2000 under said number. In said document a description is given of the way in which in a silicon semiconductor body comprising a silicon substrate on which an epitaxial silicon layer is present, a semiconductor island of silicon is formed by covering the walls of two recesses, in the form of two parallel so-termed trenches formed in the semiconductor body, with an insulating layer. By means of etching and underetching from the bottom of the trenches, the silicon semiconductor island is formed between said trenches.

Figure 8:
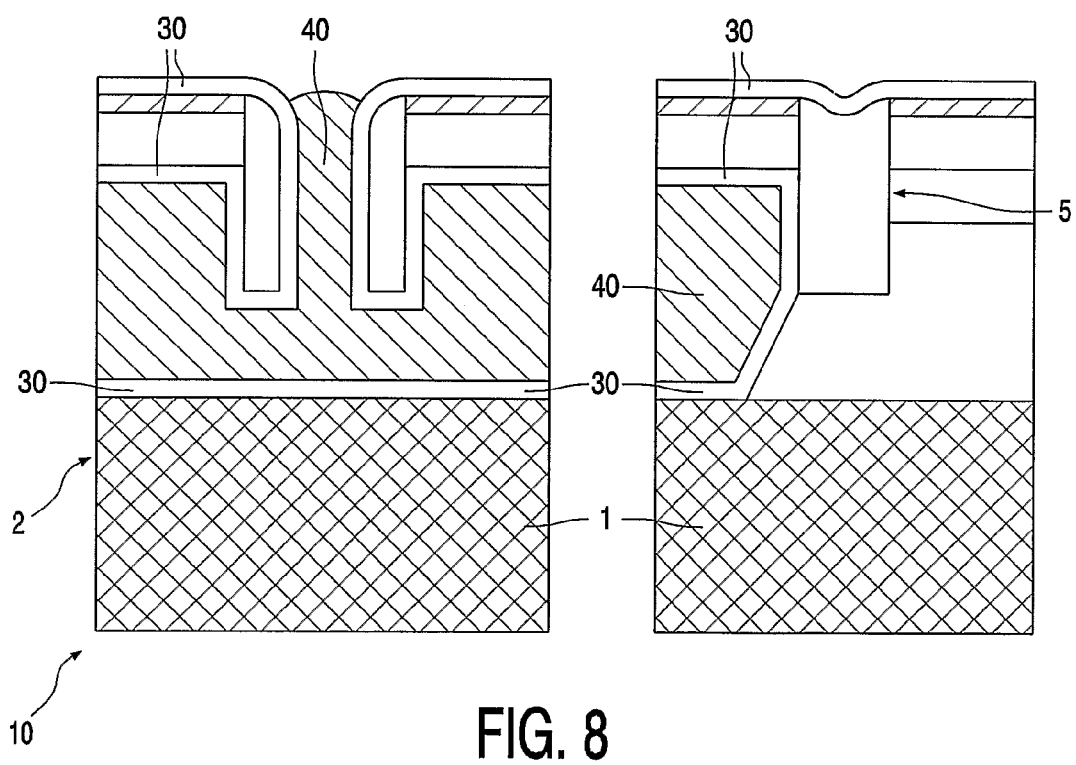

At the end faces of the trenches, isolation regions in the form of LOCOS (=Local Oxidation Of Silicon) regions (see for example FIG. 8) or so-termed trench isolation regions (see for example FIG. 9) are formed in the semiconductor body. Consequently, the semiconductor island formed is bounded on these sides and supported by regions of silicon dioxide. It is described how, in the case of trench isolation regions, first these isolation trenches are formed by etching, after which the walls thereof are covered with an isolating layer and subsequently these trenches are filled with polycrystalline silicon. Next, the trenches on either side of the semiconductor island to be formed are created as described for the situation in which LOCOS isolation regions are applied.

A drawback of the known method resides in that it is comparatively time-consuming as it comprises many steps. As a result, the method is comparatively expensive but also the yield in terms of useful devices is adversely affected.

Therefore it is an object of the present invention to provide a method of the type mentioned in the opening paragraph, which is cheaper because it comprises fewer steps.

To achieve this, a method of the type mentioned in the opening paragraph is characterized in accordance with the invention in that for both the dielectric layer and the further dielectric layer use is made of the same dielectric layer, a lateral dimension of the second recess and the thickness of the dielectric layer being chosen such that the second recess is filled substantially completely by the dielectric layer, and the lateral dimensions of the first recess being chosen such that the walls and the bottom of the first recess are provided with a uniform coating by the dielectric layer.

The invention is based first of all on the recognition that for the isolation of the walls of the first and the second recess use can be made of the same isolating layer. This already leads to a simplification of the process. The invention is further based on the recognition that a suitable choice of the thickness of the dielectric layer and the width of the second recess enables the latter to be completely filled during the deposition process of the dielectric layer. This leads to a further simplification of the process. Said choices mean that, in practice, the width of the second recess is chosen so as to comprise approximately twice, or (slightly) less than twice, the thickness of the dielectric layer to be deposited. The width of the first recess is chosen to be so large that the walls and the bottom thereof are uniformly covered by the dielectric layer without the shape of this recess being adversely affected and without the recess being filled by the dielectric layer. By virtue thereof, in this first recess, the parts of the dielectric layer covering the walls can be formed by means of an anisotropic etch process in which the flat parts of the dielectric layer, such as those at the bottom of the first recess, are removed again while the walls of the first recess remain covered with parts of the dielectric layer. The invention is finally based on the recognition that in such an anisotropic etch process the dielectric layer within the second recess is not, or at least not noticeably, attacked. A method in accordance with the invention may thus comprise comparatively few steps and lead to a high yield.

Therefore, in a preferred embodiment of a method in accordance with the invention, after the formation of the first and the second recess, the dielectric layer is applied over the entire surface of the semiconductor body, after which the flat parts of the dielectric layer are removed again by means of anisotropic etching.

Preferably, the second recess is formed as a ring-shaped groove surrounding the first recess, within which groove the semiconductor island is formed, the lateral dimension of the second recess being formed by the width of the groove. Adjacent or non-adjacent semiconductor islands may thus be readily formed in a semiconductor body.

In a favorable embodiment, before the dielectric layer is provided, further grooves are formed in the surface of the semiconductor body, which have approximately the same width as the said groove, as a result of which the semiconductor island is divided into semiconductor sub-islands. Said division may be such that the sub-islands are also electrically fully separated from each other, however, this is not necessary. An important advantage of this variant resides in that also the further grooves are completely filled during the deposition of the dielectric layer. These grooves thus constitute filled ribs which strengthen, as it were, the semiconductor island once the cavity has been formed, subjacent to the semiconductor island, in the semiconductor body. By virtue thereof, the risk of (mechanical) damage to the semiconductor island at that stage is reduced.

Preferably, the shape of the groove, viewed in projection, is square, and the further grooves are formed so as to extend from the middle of the sides of the square to the first recess situated in the center. An array or matrix of semiconductor islands can thus be readily formed in the semiconductor body.

In an attractive variant of a method in accordance with the invention, the semiconductor body is formed by a semiconductor substrate on which two semiconductor layers of a different semiconductor material are provided. By virtue thereof, it becomes possible, during the formation of the cavity in the semiconductor body, to remove the part of said semiconductor body that is situated below the first semiconductor layer by means of an etchant that is selective with respect to the material of the first semiconductor layer. The first semiconductor layer can be selectively removed with respect to the second semiconductor layer in a similar manner. Besides better control of the entire process, it also becomes possible to produce semiconductor bodies having a very small thickness.

The latter variant can, for example, be implemented by applying, onto a silicon substrate on which a silicon epitaxial layer may or may not be present, a first semiconductor layer of a mixed crystal of silicon and germanium, onto which a second semiconductor layer of silicon is subsequently applied. The composition and the thickness of the Si—Ge mixed crystal are chosen such that, on the one hand, the material exhibits a maximum deviation from silicon and, on the other hand, epitaxial growth of said layers without many defects is still possible.

Therefore, to form the cavity in the semiconductor body use is preferably made, in this variant, of an etchant for silicon that is selective with respect to the semiconductor material of the first semiconductor layer, in this case the silicon-germanium mixed crystal. In a variant, after the formation of the cavity, the first semiconductor layer is removed by means of an etchant which is selective with respect to the semiconductor material of the second semiconductor layer. Preferably, the selective etching of silicon is ceased as soon as the first semiconductor layer is reached and hence borders on the cavity, after which the first semiconductor layer is selectively removed.

By virtue of the fact that a lateral dimension of the cavity is chosen to be so large that the cavity extends in the semiconductor body in said lateral direction to beyond the second recess, it is achieved that the semiconductor island is completely (electrically) insulated from the surrounding part of the semiconductor body. In the last-mentioned variant in the previous paragraph, the lateral expansion of the cavity can be limited to as far as the second recess in a simple manner, also in the case of a rectangular geometry. The etching of the first semiconductor layer is continued until the cavity has everywhere reached the second recess, at which point etching stops automatically.

In a favorable variant, use is made in the cavity-forming process of a so-termed etch-stop layer which is positioned in the semiconductor body at the lower side of the cavity to be formed. In the case of a silicon semiconductor body, use can alternatively be made for this purpose of a layer containing a mixed crystal of silicon and germanium.

Preferably, after the formation of the cavity or cavities, the walls thereof are covered with a further dielectric layer. This layer may be formed by deposition or thermal oxidation. The cavity is preferably filled with a preferably high-ohmic material, such as polydox or SIPOS. Polycrystalline silicon can very suitably be used as a filling agent for the cavity because the coefficient of thermal expansion of that material is approximately equal to that of monocrystalline silicon, as a result of which problems during heating and/or cooling of the semiconductor body are precluded.

The invention further comprises a semiconductor body obtained by means of a method in accordance with the invention.

These and other aspects of the invention are apparent from and will be elucidated with reference to the embodiments described hereinafter.

Figure 1:
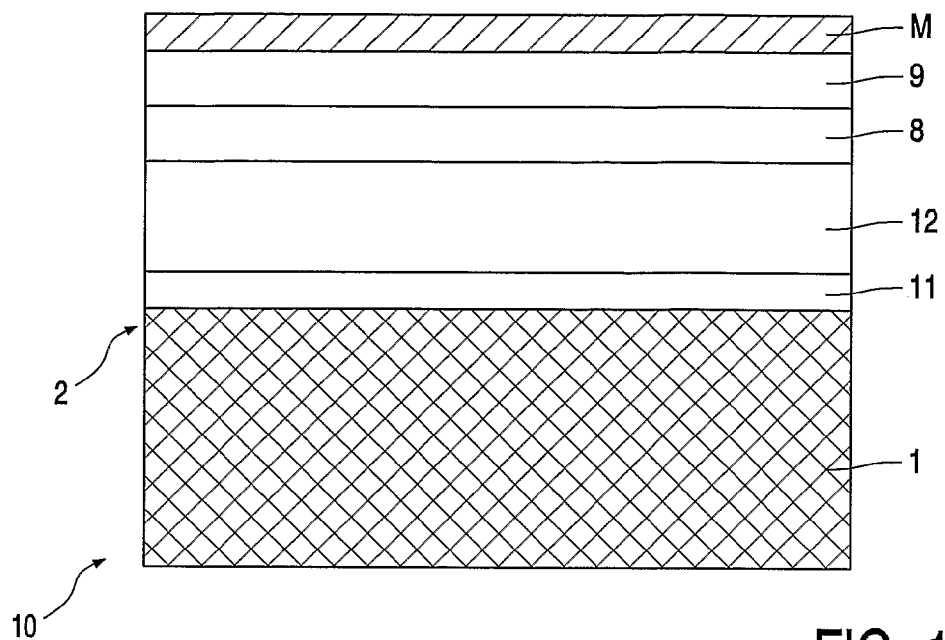
Figure 2:
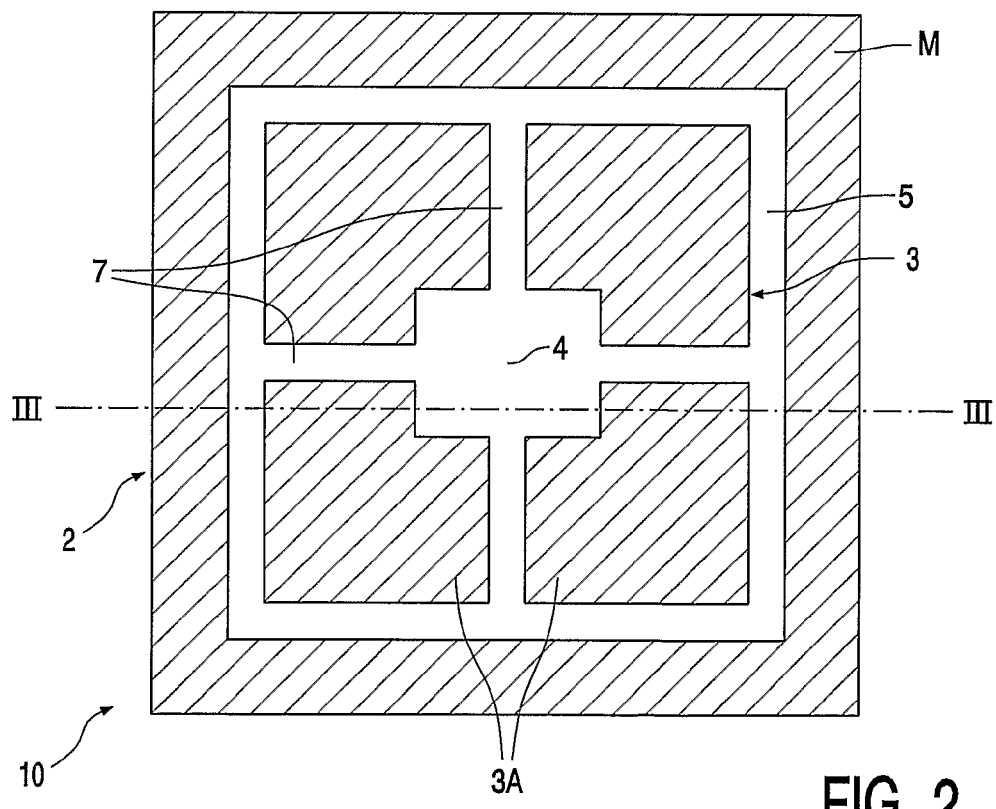
Figure 3:
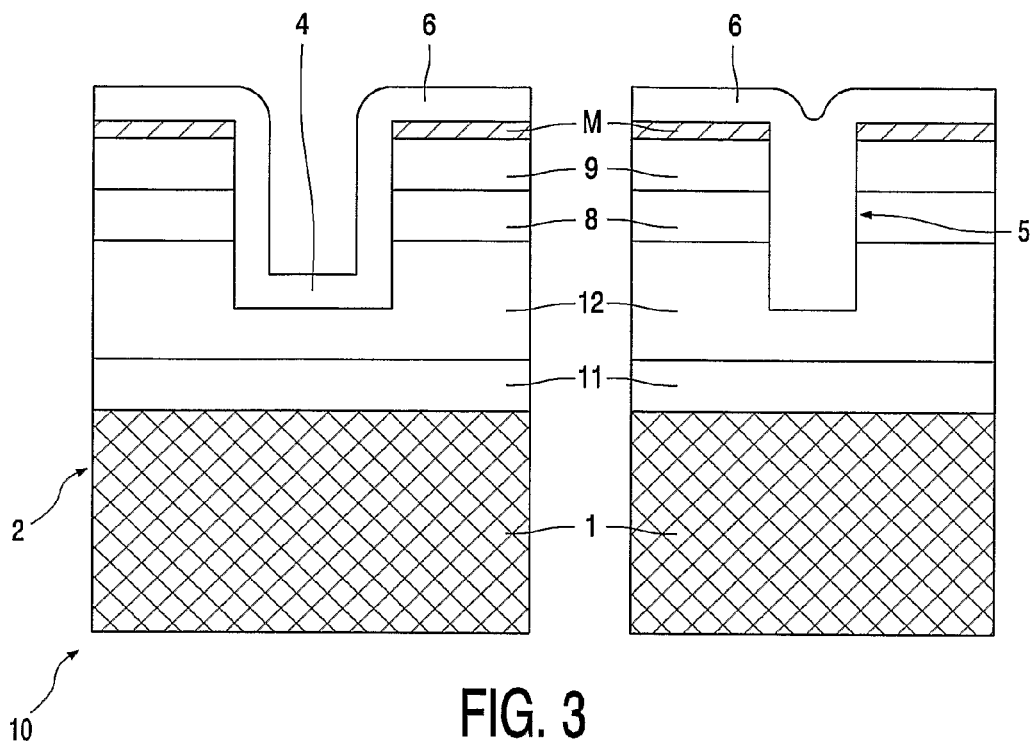
Figure 4:
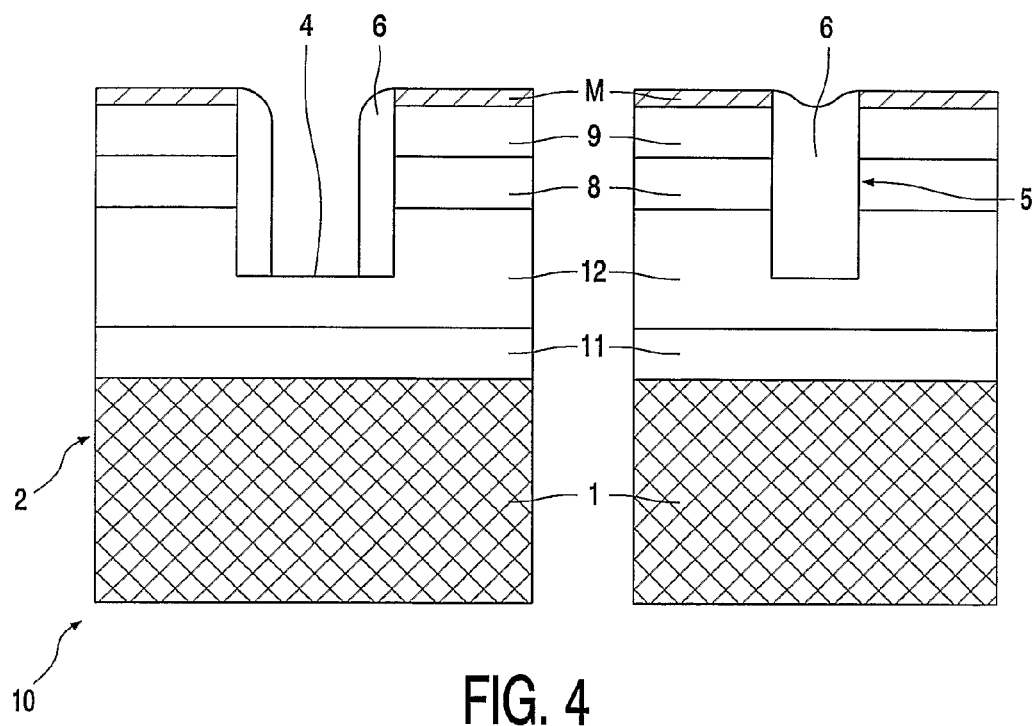
Figure 9:
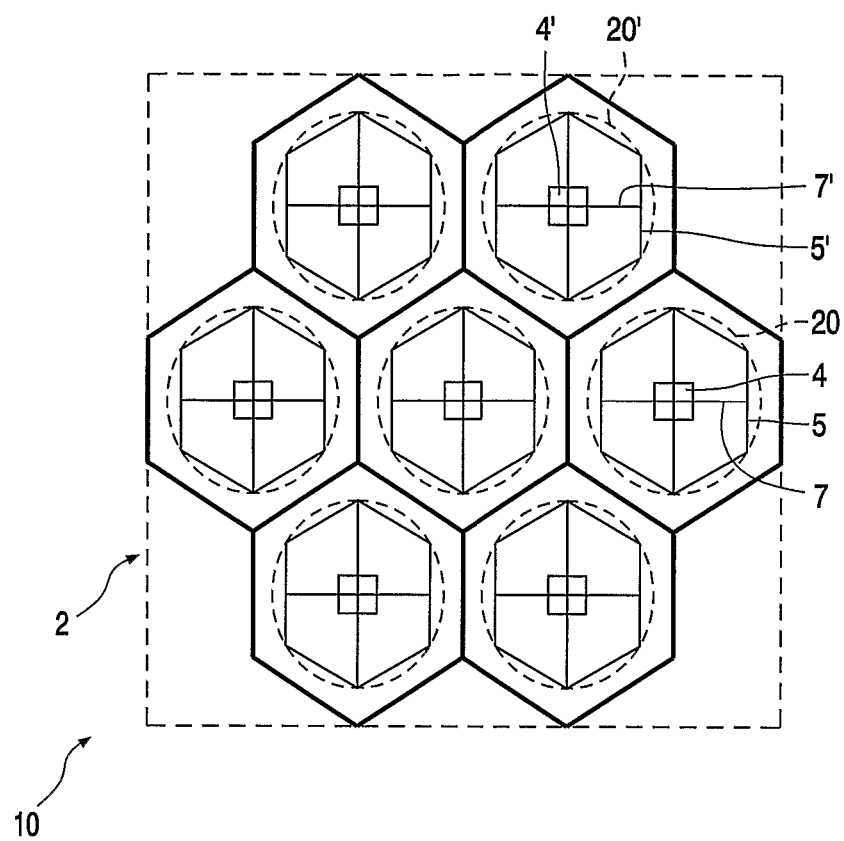
Figure 10:
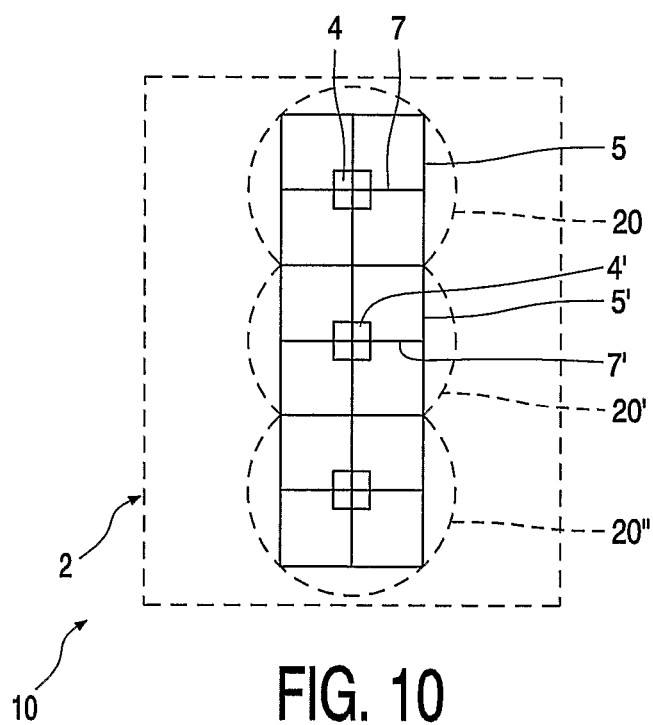

In the drawings:

FIGS. 1 through 8 are both diagrammatic and, with the exception of FIG. 2 which is a plan view, cross-sectional views, at right angles to the thickness direction, of a semiconductor device in successive stages of the manufacture by means of an embodiment of a method in accordance with the invention, and FIGS. 9 and 10 are diagrammatic, plan views of different, feasible configurations for the manufacture of a larger number of semiconductor islands by means of a method in accordance with the invention.

The Figures are not drawn to scale and some dimensions, such as dimensions in the thickness direction, are exaggerated for clarity. Corresponding regions or parts in the various Figures are indicated by means of the same hatching or the same reference numerals whenever possible.

FIGS. 1 through 8 are both diagrammatic and, with the exception of FIG. 2 which is a plan view, cross-sectional views, at right angles to the thickness direction, of a semiconductor device in successive stages of the manufacture by means of an embodiment of a method in accordance with the invention. The starting element used in the formation of the device 10 (see FIG. 1) is a semiconductor body 2 comprising a substrate 1, in this case a semiconductor substrate of silicon. A first epitaxial layer 11 is provided thereon by means of epitaxy, which epitaxial layer comprises a mixed crystal of silicon and germanium, and on said epitaxial layer there is provided an epitaxial-silicon layer 12 which in turn is provided with an epitaxial mixed-crystal layer 8 of silicon and germanium. The epitaxial process is concluded by the growth of a silicon layer 9. On top of said layer a hard masking layer M of, for example, silicon dioxide is subsequently deposited. The thickness of the Si—Ge layers 11 and 8 ranges, for example, between 1 and 50 nm, while the germanium content of those layers ranges between 10 and 30 at. %. The thickness of the silicon layers 12 and 9, in this case, is in the range of 20 to 30 nm and approximately 2 μm, respectively.

Subsequently, (see FIG. 2), the hard masking layer M is patterned by means of photolithography and etching, the hatched parts of the masking layer M, as shown in FIG. 2, not being subjected to said treatments. Next, two recesses (see FIG. 3) are formed in the semiconductor body 2 by means of etching: a central, first recess 4 which is surrounded by a second recess 5 forming a closed ring. The cross-sections of FIGS. 3 through 8 are taken along the line III-III in FIG. 2. The left part of these Figures shows a part of the semiconductor body 2 that is situated around the central recess 4, and the right-hand part of these Figures shows the part of the semiconductor body 2 that is situated around the second recess 5, i.e. around the part thereof that is situated on the right-hand side in FIG. 2. The part of the second recess 5 situated to the left of the central recess 4 in FIG. 2 has been omitted from FIGS. 3 through 8 for the sake of simplicity. This omitted part is identical to the right-hand part of the FIGS. 3 through 8.

The second recess 5 is shaped like a groove 5 whose width dimension is smaller than the lateral dimensions of the first recess 4. In this example, further grooves 7 (see FIG. 2), in this case four, are simultaneously formed in the semiconductor body 2, which further grooves connect the second recess 5 to the first recess 4, the width of said further grooves being equal to that of the second recess 5.

Subsequently, (see FIG. 3), a dielectric layer 6, in this case of silicon dioxide, is provided over the surface of the semiconductor body 2 by means of CVD (=Chemical Vapor Deposition). The thickness of this layer 6 and the dimensions of the recesses 4, 5, 7 are chosen such that the first recess 4 is provided only with a uniform coating by the layer 6, while the groove 5 (as well as the grooves 7) are completely filled by the dielectric layer 6.

Next, (see FIG. 4), the flat parts of the dielectric layer 6 are removed again by means of an anisotropic etch process, in this case a so-termed dry/plasma etch process. As a result, the walls of the recess 4 remain covered with the dielectric layer 6, while the grooves 5 (and 7) filled with said dielectric layer remain filled.

Subsequently, (see FIG. 5), in the silicon layer 12 a cavity 20 is formed below and around the first recess 4 by means of an etch process for silicon, such as an isotropic wet-chemical etch process. In this process, the layer 11, which in this example is an Si—Ge layer, serves as an etch-stop layer, which limits the depth of the cavity 20. A suitable, selective etchant is a hot ammonia solution. This etch process is then (see FIG. 6) continued, for example, until the cavity 20 extends, viewed laterally, at least as far as the filled groove 5. An—electrically insulated—semiconductor island 3 is thus formed within the groove 5, which semiconductor island, in this example, comprises parts of the layers 8, 9 and which is bounded by the insulating regions formed by the groove 5 and the parts of the dielectric layer 6 covering the walls of the first recess 4. The cavity 20 itself may remain filled with air, as is the case at this stage. Filling it with an inert gas such as nitrogen is also possible. It is alternatively possible to evacuate and seal the cavity 20.

The further grooves 7 divide, in this example, the island 3 into four sub-islands 3A (see FIG. 2), which, consequently, are also electrically insulated with respect to each other. The grooves 7, which are also filled with the dielectric layer 6, and which are thicker than the sum of the thicknesses of the layers 8, 9 forming the island 3 and the sub-island 3A, additionally provide the latter two with a certain sturdiness. Said sturdiness can also be achieved if the grooves 7 do not form a full connection between the two recesses 4, 5. Mutual electrical insulation of the sub-islands 3A and strengthening of the island 3 and the sub-islands are functions which can also be performed separately and hence, unlike the example, do not have to be performed simultaneously.

In this example, (see FIG. 7), etching of the cavity 20 is continued by means of an etchant which selectively etches Si—Ge with respect to silicon. A suitable selective etchant is, for example, a mixture of hydrogen fluoride, hydrogen peroxide and acetic acid in a (volume) ratio of 1:2:3. In this manner, the parts of the Si—Ge-containing layers 11, 8 bordering on the cavity 20 are removed. In this manner, an island 3/sub-islands 3A are formed, in this example, which contain exclusively silicon. Subsequently, the walls of the cavity 20 are covered with a thin dielectric layer 30 of, for example, silicon dioxide. This can be achieved by a short thermal oxidation. In this example, the layer 30 is formed by first depositing a thin polycrystalline silicon layer 30, which is subsequently converted by means of oxidation into a silicon dioxide-containing layer 30.

Next, (see FIG. 8), the cavity is filled with high-ohmic polycrystalline silicon 40. Said cavity 20 may alternatively be filled with an oxygen-containing polycrystalline silicon which is known, for example, as SIPOS or POLYDOX. The advantage of polycrystalline silicon is that the coefficient of thermal expansion thereof is approximately equal to that of monocrystalline silicon.

Figure 5:
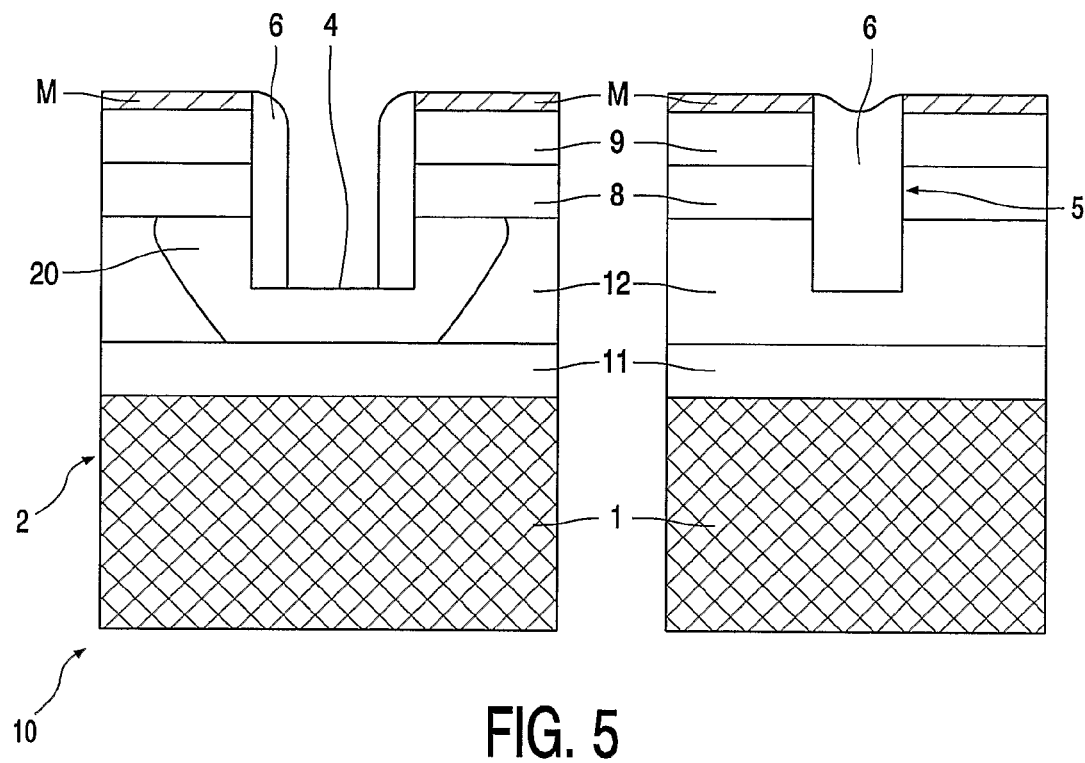
Figure 6:
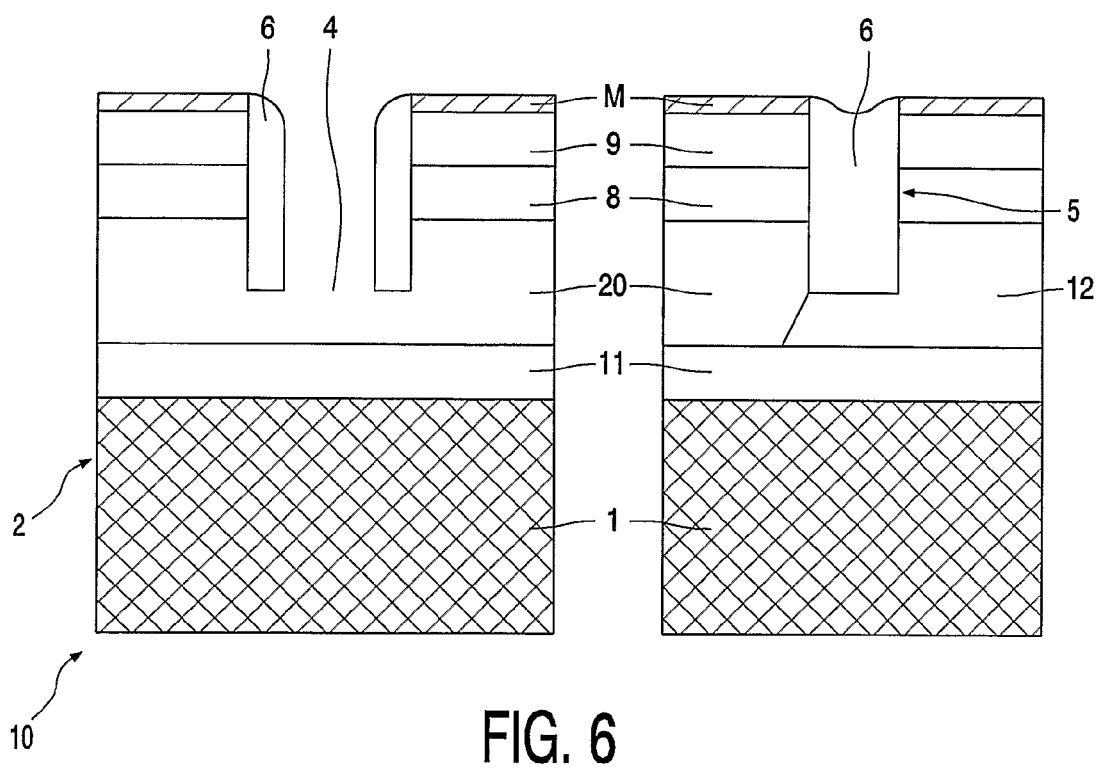
Figure 7:
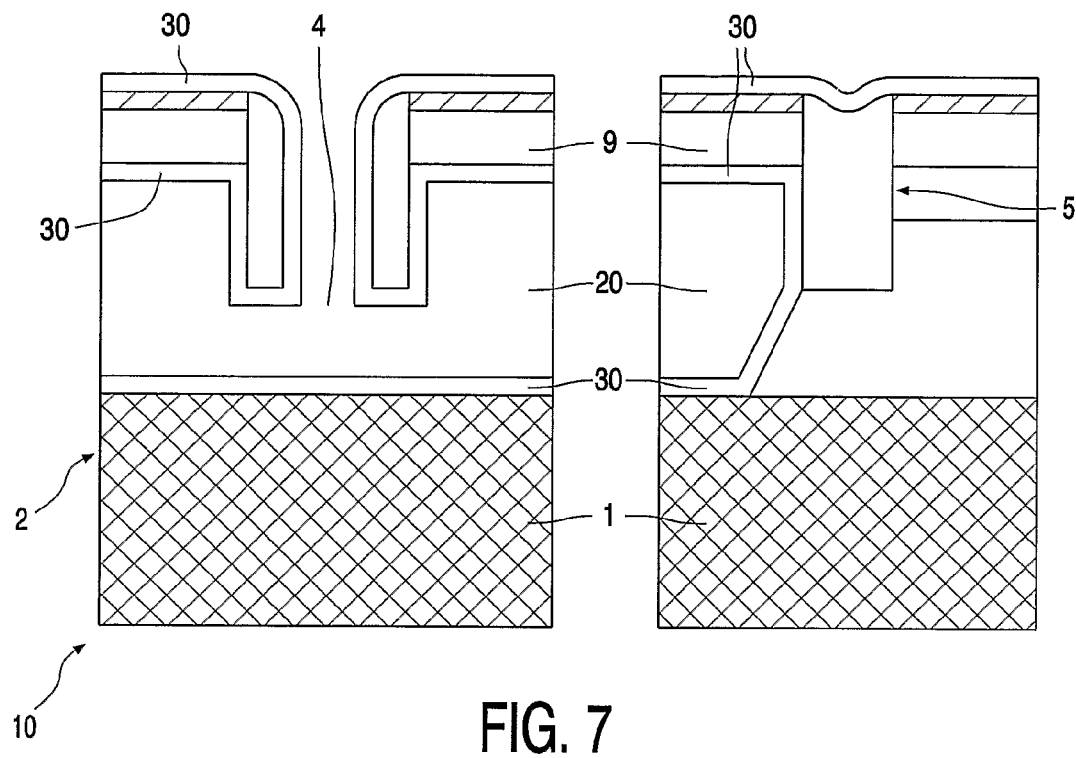

In an attractive variant of the inventive method of this example, etching by means of the etchant which selectively etches silicon is stopped at the stage shown in FIG. 5, i.e. after only a small lateral underetch which is sufficient, however, to allow the cavity 20 to border on the Si—Ge layer. This is immediately followed by etching of the Si—Ge layer (as shown in FIG. 9) by means of the suitable etchant. In this manner, a deeper portion of the cavity 20 may have comparatively small lateral dimensions, while the cavity 20 as a whole can still extend as far as the groove 5 without being capable of extending over an unnecessarily large distance, i.e. to beyond the groove 5. As a result, to fill the cavity 20 less material is required in this case.

The manufacture of the device 10 is then completed by forming active semiconductor elements, such as MOS or bipolar transistors, within and/or outside the island 3/the sub-islands 3A. For this purpose, use is made of processes and process steps which are customarily used in the field of IC technology. The device 10 may of course be provided with one or more other active and/or passive elements, such as diodes, resistors, coils and capacitors. A suitable pattern of connection conductors and/or bond pads is also formed, and individual semiconductor devices 10, which may comprise a discrete or semi-discrete device 10 or even an IC, are provided by means of separation techniques such as sawing.

FIGS. 9 and 10 are diagrammatic, plan views of different, feasible configurations for the manufacture of a larger number of semiconductor islands by means of a method in accordance with the invention. FIG. 9 shows a hexagonal configuration of a number of combinations of first and second recess 4, 5, 4', 5' as well as further grooves 7, 7', such as in the example given above. The dotted lines show the circumference of the cavities 20, 20' formed. This configuration is roughly equivalent to a close sphere packing and is attractive because of its high degree of efficiency of the semiconductor body 2.

FIG. 10 shows a cubic configuration of a plurality of islands 3 and sub-islands 3A, as discussed in the example given above. In this, more practical, configuration the cavities 20, 20' contact each other. FIG. 10 shows an array of three cavities 20, 20', 20".

The invention is not limited to the exemplary embodiment described above, and within the scope of the invention many variations and modifications are possible to those skilled in the art. For example, devices can be manufactured having a different geometry and/or different dimensions. It is explicitly noted that the term "island" as used herein is to be understood to include also a "peninsula". This means that, for example, the second recess may have an interruption, as a result of which the island is (electrically) connected to the part of the semiconductor body situated outside said island. If the island comprises sub-islands, it is also possible that one or more of said sub-islands are connected to the part of the semiconductor body situated outside said sub-islands. Also the further recess/grooves may be provided with one or more interruptions. The island (or peninsula) may thus be subdivided into areas having a meandering structure.

It is further noted that the first semiconductor layer, which contains Si—Ge in the example given above, can be advantageously used in semiconductor elements situated within or outside the island. If a bipolar transistor is formed, for example, outside the island (as described in the patent specification mentioned in the introductory part), the Si—Ge layer can be used there to improve properties of the bipolar transistor. Within the island, where for example MOS transistors can be formed, the (mechanical) stress associated with the presence of a Si—Ge layer may be used, for example, to influence the mobility, for example, not in an PMOST but in an NMOST.

It is to be noted that materials other than those mentioned in the examples may alternatively be used within the scope of the invention. Also other deposition techniques may be used for the above-mentioned materials or other materials, such as epitaxy, CVD (=Chemical Vapor Deposition), sputtering and vaporization. Instead of wet-chemical etching methods use can alternatively be made of "dry" techniques, such as plasma etching, and vice versa.

Finally, it is noted that the device may comprise additional active and passive semiconductor elements or electronic components, such as a larger number of diodes and/or transistors and resistors and/or capacitors, whether or not in the form of an integrated circuit. The manufacturing process is of course efficiently adapted thereto.

The invention claimed is:

1. A method of manufacturing a semiconductor device comprising a substrate and a semiconductor body in which at least one semiconductor element is formed, wherein, in the semiconductor body, a semiconductor island is formed by forming, in the surface of the semiconductor body, a first recess the walls of which are covered with a dielectric layer (6), after which a lateral part of the semiconductor body is removed by means of underetching via the bottom of the first recess, thereby forming a cavity in the semiconductor body above which the semiconductor island is formed, and wherein a second recess is formed in the surface of the semiconductor body, the walls of said second recess being covered with the dielectric layer, and one of the walls of the second recess covered with the dielectric layer being used to form a side wall of the semiconductor island, characterized in that a lateral dimension of the second recess and the thickness of the dielectric layer being chosen such that the second recess is filled substantially completely by the dielectric layer, and the lateral dimensions of the first recess being chosen such that the walls and the bottom of the first recess are provided with a uniform coating by the dielectric layer.

2. A method as claimed in claim 1, characterized in that after the formation of the first and the second recesses, the dielectric layer is applied over the entire surface of the semiconductor body, after which the flat parts of the dielectric layer are removed by means of anisotropic etching.

3. A method as claimed in claim 1, characterized in that the second recess is formed as a ring-shaped groove surrounding the first recess, within which groove the semiconductor island is formed, the lateral dimension of the second recess being formed by the width of the groove.

4. A method as claimed in claim 1, characterized in that before the dielectric layer is provided, grooves are formed in the surface of the semiconductor body, which have approximately the same width as the second recess, as a result of which the semiconductor island is divided into semiconductor sub-islands.

5. A method as claimed in claim 4, characterized in that the shape of the second recess, viewed in projection, is square, and the grooves are formed so as to extend from the middle of the sides of the square to the first recess situated in the center.

6. A method as claimed in claim 1, characterized in that the semiconductor body is formed by a semiconductor substrate on which first and second semiconductor layers, which are formed of different semiconductor materials, are provided.

7. A method as claimed in claim 6, characterized in that the first semiconductor layer of a mixed crystal of silicon and germanium is provided on the semiconductor substrate, and the second semiconductor layer of silicon is provided on the first semiconductor layer.

8. A method as claimed in claim 6, characterized in that to form the cavity in the semiconductor body use is made of an etchant for silicon which is selective with respect to the semiconductor material of the first semiconductor layer.

9. A method as claimed in claim 8, characterized in that after the formation of the cavity, the first semiconductor layer is removed by means of an etchant which is selective with respect to the semiconductor material of the second semiconductor layer.

10. A method as claimed in claim 8, characterized in that during the formation of the cavity, the etching of silicon is stopped as soon as the cavity has reached the first semiconductor layer, after which the first semiconductor layer is selectively removed.

11. A method as claimed in claim 1, characterized in that a lateral dimension of the cavity is chosen to be so large that the cavity in the semiconductor body extends, in this lateral direction, at least as far as the second recess.

12. A method as claimed in claim 1, characterized in that, in the semiconductor body, a further layer is formed from a different semiconductor material than the part of the semiconductor body (2) in which the cavity is formed.

13. A method as claimed in claim 1, characterized in that after the formation of the cavity, the walls thereof are covered with a different dielectric layer.

14. A method as claimed in claim 13, characterized in that the cavity is filled with polycrystalline silicon after the walls of the cavity are covered with the different dielectric layer.

15. A method as claimed in claim 1, characterized in that after the formation of the cavity, this cavity is filled with a high-ohmic material.

* * * * *